US010746824B2

(12) United States Patent
Haan et al.

(10) Patent No.: US 10,746,824 B2
(45) Date of Patent: Aug. 18, 2020

(54) MAGNETIC RESONANCE FORCE DETECTION APPARATUS AND ASSOCIATED METHODS

(71) Applicant: UNIVERSITEIT LEIDEN, Leiden (NL)

(72) Inventors: Arthur den Haan, Leiden (NL); Jelmer Wagenaar, Leiden (NL); Tjerk Oosterkamp, Leiden (NL); Rembrandt Donkersloot, Leiden (NL)

(73) Assignee: UNIVERSITEIT LEIDEN, Leiden (NL)

( * ) Notice: Subject to any disclaimer, the term of this patent is extended or adjusted under 35 U.S.C. 154(b) by 38 days.

(21) Appl. No.: 16/081,210

(22) PCT Filed: Mar. 1, 2017

(86) PCT No.: PCT/EP2017/054796
§ 371 (c)(1),
(2) Date: Aug. 30, 2018

(87) PCT Pub. No.: WO2017/149024
PCT Pub. Date: Sep. 8, 2017

(65) Prior Publication Data
US 2019/0072623 A1      Mar. 7, 2019

(30) Foreign Application Priority Data

Mar. 1, 2016    (GB) .................................. 1603539.6

(51) Int. Cl.
*G01R 33/32*        (2006.01)
*G01N 24/08*        (2006.01)
(Continued)

(52) U.S. Cl.
CPC .......... *G01R 33/326* (2013.01); *G01N 24/08* (2013.01); *G01N 24/10* (2013.01); *G01Q 60/52* (2013.01);
(Continued)

(58) Field of Classification Search
USPC ........................................................ 324/307
See application file for complete search history.

(56) References Cited

U.S. PATENT DOCUMENTS

2010/0301854 A1    12/2010  Rugar
2015/0338437 A1*   11/2015  Stan ........................ G01Q 10/00
                                                                  850/1

OTHER PUBLICATIONS

International Search Report and Written Opinion for PCT/EP2017/054796 dated Jun. 6, 2017.
(Continued)

*Primary Examiner* — Jay Patidar
(74) *Attorney, Agent, or Firm* — Michael A. Collins; Billion & Armitage (57) ABSTRACT

A magnetic resonance force detection apparatus, comprising: a sample carrier for carrying a sample to be tested; a magnetic field source configured to provide a magnetic field to a sample when it is carried by the sample carrier; a support for supporting either the sample carrier or the magnetic field source; a support-driving-mechanism configured to drive the support such that the sample carrier moves relative to the magnetic field source, such that the magnetic field is configured to cause the spins of one or more nuclei or electrons in the sample to flip, and wherein the flipping of spins exerts a force on the support; and a support-displacement-measuring-sensor configured to measure displacement of the support and generate a signal representative of the displacement of the support.

18 Claims, 3 Drawing Sheets

(51) Int. Cl.
*G01N 24/10* (2006.01)
*G01R 33/038* (2006.01)
*G01Q 60/52* (2010.01)
*G01R 33/60* (2006.01)

(52) U.S. Cl.
CPC ....... *G01R 33/0385* (2013.01); *G01R 33/323* (2013.01); *G01R 33/60* (2013.01)

(56) References Cited

OTHER PUBLICATIONS

Den Haan, et al., "Spin-mediated dissipation and frequency shifts of a cantilever at milliKelvin", Physical Review. B, Condensed Matter and Materials Physics, vol. 92, No. 23, Dec. 28, 2015, 5 pages.
Kuehn, et al., "Advances in mechanical detection of magnetic resonance", The Journal of Chemical Physics, vol. 128, No. 5, Feb. 7, 2008, pp. 1-19.

\* cited by examiner

Figure 3

MAGNETIC RESONANCE FORCE DETECTION APPARATUS AND ASSOCIATED METHODS

CROSS-REFERENCE TO RELATED APPLICATIONS

This application is a National Stage Application of International Application No. PCT/EP2017/054796, filed on Mar. 1, 2017, which claims benefit of Application No. 1603539.6, filed on Mar. 1, 2017 in Great Britain (GB) and which applications are incorporated herein by reference. A claim of priority to all, to the extent appropriate, is made.

BACKGROUND

The present disclosure relates to a magnetic resonance force detection apparatus, and associated methods for using such apparatus.

Magnetic resonance force microscopy (MRFM) involves the combination of magnetic resonance imaging (MRI) with the techniques of scanning probe microscopy (SPM). Essentially, the technique relies on detecting the tiny force resulting from the modulation or flipping of nuclear or electron spins. This has led to the demonstration of nuclear spin imaging of a virus particle with a spatial resolution of 4 nm. The sensitivity can be improved by increasing the magnetic field gradient provided by an integrated nanomagnetic tip near the nuclear spins and a "microwire" RF source. Yet, because of the small forces involved, relatively long averaging times are required to be able to distinguish the forces due to the controlled manipulation of the nuclear spins from the thermal forces acting on a cantilever that is used for force detection.

SUMMARY

According to a first aspect, there is provided a magnetic resonance force detection apparatus, comprising:
 a sample carrier for carrying a sample to be tested;
 a magnetic field source configured to provide a magnetic field to a sample when it is carried by the sample carrier;
 a support for supporting either the sample carrier or the magnetic field source;
 a support-driving-mechanism configured to drive the support such that the sample carrier moves relative to the magnetic field source, such that the magnetic field is configured to cause the spins of one or more nuclei or electrons in the sample to flip, and wherein the flipping of spins exerts a force on the support; and
 a support-displacement-measuring-sensor configured to measure displacement of the support and generate a signal representative of the displacement of the support.

Using such a support-driving-mechanism magnetic resonance force detection apparatus, can be advantageous because it can generate very low heat dissipation, which can allow experiments to be performed at very low temperatures, of the order of milli-Kelvins.

The support-driving-mechanism may be configured to mechanically drive the support such that the sample carrier moves relative to the magnetic field source. The support-driving-mechanism may be configured to drive the support such that the sample carrier oscillates relative to the magnetic field source.

The relative movement between the sample carrier and the magnetic field source may be configured to cause a sample that is carried by the sample carrier to experience an oscillating magnetic field.

The magnetic field source may be configured to provide a static magnetic field.

The magnetic field source may comprise a magnetic particle.

The support-driving-mechanism may be configured to drive the support at an RF frequency. The support-driving-mechanism may be configured to drive the support at a frequency that corresponds to an eigen-mode frequency of the support.

The support-driving-mechanism may comprise a piezo-electric element that vibrates the support.

The magnetic resonance force detection apparatus may further comprise a processor configured to process the signal representative of the displacement of the support in order to determine a component of the displacement of the support caused by the flipping of spins in the sample due to the magnetic field source.

The magnetic resonance force detection apparatus may further comprise a processor configured to control the support-driving-mechanism in order to define:
 a driving-mode-of-operation, during which the support-driving-mechanism drives the support; and
 a measuring-mode-of-operation, during which an output signal of the support-displacement-measuring-sensor is used to generate the signal representative of the displacement of the support.

During the measuring-mode-of-operation, the support-driving-mechanism may be configured to not drive the support.

The magnetic resonance force detection apparatus may further comprising a processor configured to control the support-driving-mechanism in order to drive the support at a driving-frequency, which causes the spins of the one or more nuclei or electrons in the sample to flip at a flipping-frequency. The driving-frequency may be different to the flipping-frequency.

The magnetic field source may be attached to the support. The support-driving-mechanism may comprise a driving wire that is in the vicinity of the magnetic field source. The driving wire may be configured to pass an alternating current such that it generates an alternating magnetic field in the magnetic field source, and thereby causes the magnetic field source to move relative to the sample carrier. The sample carrier may be remote from the support.

The magnetic resonance force detection apparatus may further comprise a support-tuning-component configured to set an eigen-mode frequency of the support.

There may be provided a method of performing magnetic resonance force detection for a sample using a magnetic field source, wherein either the sample or the magnetic field source is supported by a support, the method comprising:
 driving the support such that a sample carrier moves relative to the magnetic field source, such that the magnetic field is configured to cause the spins of one or more nuclei or electrons in the sample to flip, and wherein the flipping of spins exerts a force on the support;
 measuring a displacement of the support; and
 generating a signal representative of the displacement of the support.

There may be provided a computer program, which when run on a computer, causes the computer to configure any apparatus, including a magnetic resonance force detection apparatus, controller, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

The computer program may be provided on a computer readable medium, which may be a physical computer readable medium such as a disc or a memory device, or may be embodied as a transient signal. Such a transient signal may be a network download, including an internet download.

BRIEF DESCRIPTION OF THE DRAWINGS

A description is now given, by way of example only, with reference to the accompanying drawings, in which.

DETAILED DESCRIPTION

One or more embodiments described herein relate to a mechanical resonator for generating a radio frequency field, which may also be referred to as a B1 field, in a magnetic resonance force detection apparatus. For instance, a support can be mechanically driven so that a sample carrier moves relative to a magnetic field source, which results in an oscillating magnetic field that causes the spins of one or more nuclei or electrons in a sample to flip. Such a magnetic resonance force detection apparatus can generate very low heat dissipation such that experiments can be performed at temperatures of the order of milli-Kelvins.

Generating high B1-fields with low heat dissipation is a challenge in nano-MRI applications. Due to low cooling powers and low heat-capacities at a sample site, this dissipation can become problematic at milli-Kelvin temperatures. However, low temperatures may be required in order to provide sufficient sensitivity to acquire high resolution data or images. Especially in nuclear magnetic resonance force microscopy (NMRFM) at milli-Kelvin temperatures, sources of heat dissipation should be reduced as much as possible.

One way of applying RF-fields is by using a radio-frequency coil or a RF-wire. By the application of a constriction in a copper RF-wire, current densities of $10^7$ A/m$^2$ and RF-field strengths of more than 4 mT can be achieved. At these high fields, the dissipation in the RF-wire can be less than 350 µW. Although being an improvement in terms of low heat dissipation, it still may not be possible to achieve milli-Kelvin temperatures.

Figure 1:
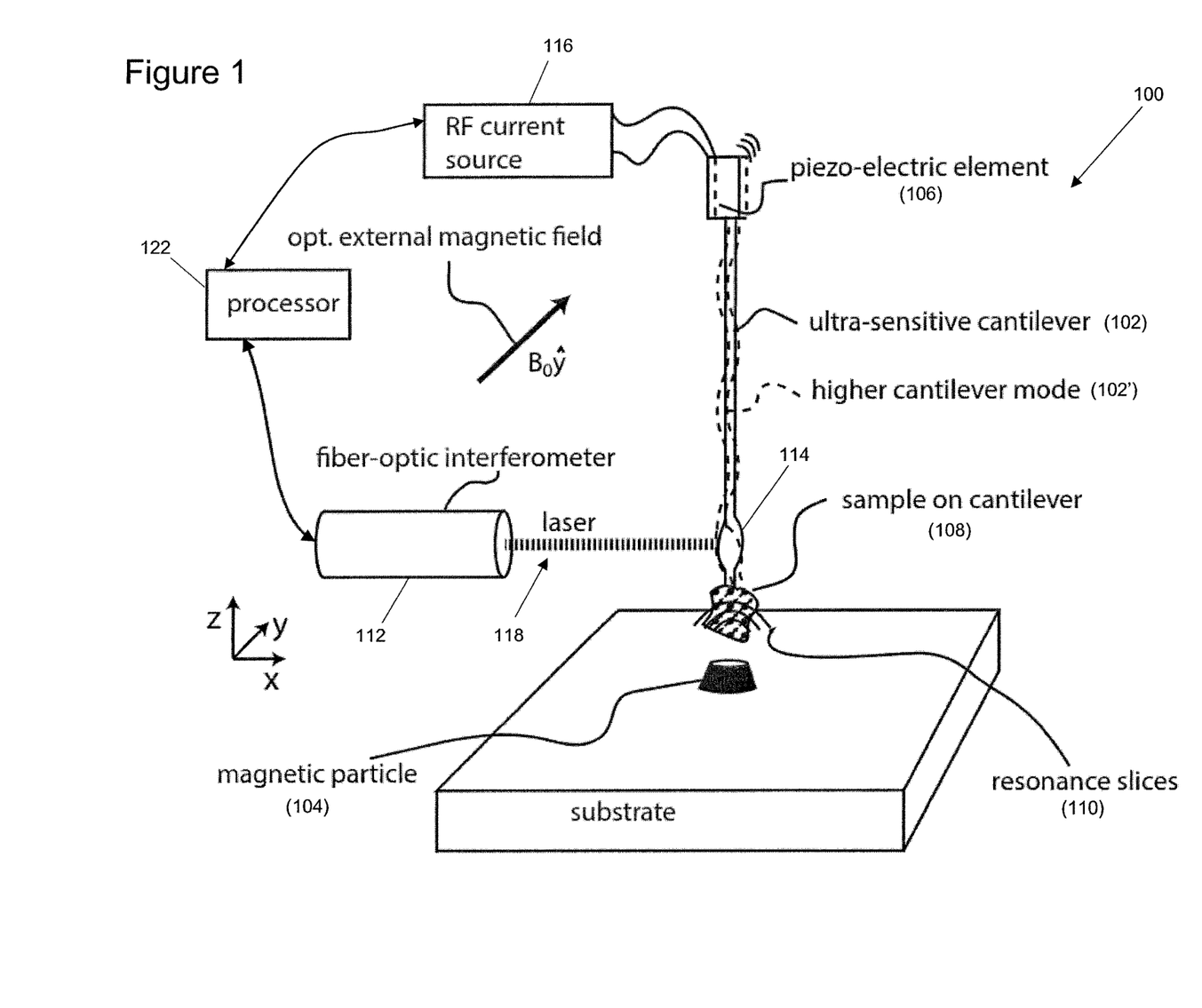
FIG. 1 illustrates a magnetic resonance force detection apparatus.

FIG. 1 illustrates a magnetic resonance force detection apparatus 100. The magnetic resonance force detection apparatus 100 can be used for imaging nanoscale biological structures, in some embodiments imaging down to the scale of individual molecules. The apparatus of FIG. 1 may be known as a sample-on-cantilever configuration.

The apparatus 100 comprises a support, which in this embodiment is an ultra-sensitive cantilever 102, for supporting a sample 108. The sample 108 is attached to the free end of the cantilever 102, which can be considered as a sample carrier.

The apparatus 100 may be located in a fixed background magnetic field, also known as an external magnetic field $B_o \hat{y}$, although in other embodiments the external magnetic field may not be necessary. The external background field causes the spin of nuclei to be aligned in the absence of other magnetic fields, particularly in the absence of a resonant slice 110 as will be discussed below.

Located near the sample 108 is a magnetic field source 104 that is configured to provide a magnetic field to the sample 108 when it is carried by the sample carrier. The magnetic field source 104 can provide a static magnetic field, and in this example is a magnetic particle.

The apparatus 100 includes a support-driving-mechanism configured to drive the cantilever 102 such that the sample carrier moves relative to the magnetic field source 104. In this way, the static magnetic field generated by the magnetic field source 104 can be used to expose the sample to a radio-frequency (RF) magnetic field such that the spins of one or more nuclei or electrons in the sample are flipped. It will be appreciated that it is the relative movement between the sample 108 and the magnetic field source 104 that generates the RF/oscillating magnetic field and causes the spins to flip. It will also be appreciated, due to the context of this document, that "flipping a spin" can be considered as changing a magnetization of a spin.

In this example, the support-driving-mechanism includes a piezo-electric element 106 and a Piezo-RF-current-source 116. The piezo-electric element 106 is coupled to the cantilever 102, in this example at an opposite end to the sample carrier. The piezo-electric element 106 can be said to be attached to the cantilever 102 at a position that is remote from the sample carrier. The Piezo-RF-current-source 116 can provide an alternating/periodic current to the piezo-electric element 106 such that the piezo-electric element 106 vibrates and applies a mechanical force to the cantilever 102.

The frequency of the Piezo-RF-current-source 116 can be set such that the piezo-electric element 106 drives the cantilever 102 at one of its higher eigen-mode frequencies. The displacement of the cantilever 102 when it is being driven at an eigen-mode frequency is shown in dashed lines with reference 102' in FIG. 1. In this way, sample 108 is moved relative to the magnetic field source 104 such that an oscillating magnetic field is generated in the sample 108. The oscillating magnetic field in FIG. 1 is illustrated as resonant slices 110. The resonant slices 110 are volumes in which the oscillating magnetic field causes the spins of one or more nuclei in the sample 108 to flip.

The oscillating magnetic field can be used as a source for nuclear magnetic resonance (NMR) and possibly also for electron spin- or ferro-magnetic resonance. Meanwhile, the interaction with the magnetic moments from the nuclear spins can be measured by the same cantilever using techniques known as Magnetic Resonance Force Microscopy as will be discussed below.

In some embodiments, the polarization of the spins is due to the naturally occurring $\sqrt{N}$ statistical component of the spin ensemble, where N is the number of spins in the measurement volume/resonant slice. The spins can be flipped for a period of time such that statistics can be used to obtain an averaged value for N.

The application of a resonant slice 110 causes nuclei to flip. The magnetic field that is present in a resonant slice is at the nuclear magnetic resonance frequency of the nuclei that are to be flipped. That is, the oscillating magnetic field induces magnetic resonance in a thin "resonant slice" of spins where the Larmor resonance condition is fulfilled.

The support-driving-mechanism of FIG. 1, which includes the piezo-RF-current-source 116 and the piezo-electric element 106, can be a simple way of implementing a mechanical mechanism for moving the sample 108 relative to the magnetic field source 108. Also, the piezo-RF-current-source 116 and the piezo-electric element 106 can enable the cantilever 102 to be kept at very low temperatures. This because use of a mechanical driving mechanism to generate the oscillating magnetic field can avoid or reduce a need for components that generate significant heat. (In this context, even a few Kelvin can be considered as significant heat.)

In contrast, if an RF-source that consists of a coil were used to generate the oscillating magnetic field due to RF-currents in the coil, or by using a micro wire, then huge currents may have to be sent through the wire. These huge current would generate a lot of heat.

It will be appreciated that when the spins flip, they exert a force on the cantilever 102 to which the sample 108 is attached. The force applied to the cantilever 102 by the spins of nuclei in the sample 108 flipping causes the cantilever 102 to be displaced, and this displacement can be detected by a support-displacement-measuring-sensor. In this embodiment, the cantilever 102 is designed such that it is much wider than it is thick, and therefore the cantilever 102 is displaced/flexed in a direction that is perpendicular to its thickness. The resonant frequency of the cantilever 102 in this dimension is known, and the oscillating magnetic field is controlled in order to flip the spins of the nuclei at a frequency that causes the cantilever 102 to resonate in the desired dimension.

The support-displacement-measuring-sensor in this embodiment comprises a fibre-optic interferometer 112 which focuses laser light 118 on to a paddle 114 associated with the cantilever 102. The paddle 114 is near the end of the cantilever 102 to which the sample 108 is attached. The laser light 118 is reflected back to the fibre-optic interferometer 112 by the paddle 114, such that the displacement of the cantilever 102 can be determined and a signal representative of the displacement of the cantilever can be generated.

In this embodiment, the fibre-optic interferometer 112 is in communication with a processor 122, such that the fibre-optic interferometer 112 can provide the processor 122 with one or more signals representative of the displacement of the cantilever 102.

The processor 122 is configured to process the received signal(s) representative of the displacement of the cantilever 102 in order to determine a component of the displacement of the cantilever 102 caused by the flipping of spins in the sample due to the magnetic field source 104.

In some examples, the processor 122 can control the Piezo-RF-current-source 116 of the support-driving-mechanism in order to define a driving-mode-of-operation and a measuring-mode-of-operation of the apparatus 100. During the driving-mode-of-operation, the support-driving-mechanism drives the cantilever 102 such that the sample 108 is moved relative to the magnetic field source 104, as discussed above. The cantilever 102 can be driven at a driving-frequency. The driving-frequency is set such that it causes the spins of the one or more nuclei or electrons in the sample 108 to flip at a flipping-frequency. The driving-frequency can be different to the flipping-frequency. The driving-frequency and the flipping-frequency can be related to eigen-modes/resonant frequencies of the cantilever 102.

The driving-frequency can take a range of values, for example between 30 kHz and 1 MHz (or even higher), with approximately 10 frequencies. It will be appreciated that if this frequency range increases, then the number of eigen-frequencies can be increased as well. A specific driving-frequency that is used can be particular for a given experiment.

The flipping-frequency can be linearly dependent on the magnitude of the B1-field. This B1-field can be generated by driving a higher mode of the magnetic cantilever 102. The larger this movement, the larger the magnitude of the B1-field and therefore the flipping-frequency. A high enough flipping frequency can give more room for spin manipulations. In some examples, a flipping-frequency can be less than 30 kHz. In an application for imaging a virus, a flipping frequency of approximately 30 kHz can cause the MRFM to operate at or near its full strength, whilst a drive frequency of larger than 1 MHz can be used.

In one specific example, the flipping-frequency can be 3 kHz, which equals the first eigen-mode of the cantilever 102, and the driving-frequency can be 542 kHz, which equals the $8^{th}$ eigen-mode of the cantilever 102.

During the measuring-mode-of-operation, the signal representative of the displacement of the cantilever 102 that is received from the fibre-optic interferometer 112 is considered to be representative of the displacement of the cantilever 102 caused by the flipping of spins in the sample 108 due to the magnetic field source 104. It will be appreciated that the actual processing of the signal representative of the displacement of the cantilever 102 does not necessarily need to be performed during the measuring-mode-of-operation. The processor 122 can process the signal representative of the displacement of the cantilever 102 that was recorded during the measuring-mode-of-operation in order to determine a component of the displacement of the cantilever that corresponds to the flipping-frequency of the spins.

The processor 122 can alternate between these two modes of operation such that they are mutually exclusive. In this way, during the measuring-mode-of-operation the support-driving-mechanism is controlled so that it does not drive the cantilever 102. This may be achieved by controlling the Piezo-RF-current-source 116 such that it does not provide a current to the piezo-electric element 106. This can be considered advantageous because it can be efficient in terms of the amount of processing that is required to determine the displacement of the cantilever 102 caused by the flipping of spins in the sample 108. For example, the processor 122 may not need to significantly distinguish between (i) displacement of the cantilever 102 due to it being driven by the piezo-electric element 106; and (ii) displacement of the cantilever 102 caused by the flipping of spins in the sample 108.

Alternatively, the processor 122 can operate the apparatus 100 such that it is simultaneously in the driving-mode-of-operation and the measuring-mode-of-operation. In this way, the processor 122 can process the signal representative of the displacement of the cantilever 102 in order to determine a component of the displacement of the cantilever 102 caused by the flipping of spins in the sample 108, by identifying and removing the displacement of the cantilever 102 due to it being driven by the piezo-electric element 106. For example, a Fourier transform can be applied to the signal representative of the displacement of the cantilever 102 in order for components at different frequencies to be identified. Then, based on either (a) the frequency with which the cantilever 102 was driven, and/or (b) the frequency at which the spins in the sample 108 were flipped, the processor 122 can determine the displacement of the cantilever 102 caused by the flipping of spins in the sample 108. In this way, the processor 122 can distinguish between driven-displacement and spin-related-displacement.

The magnetic field source 104 may be provided as a superconducting particle. Due to the Meissner effect, the field lines of an externally applied field are bent, resulting in a gradient magnetic field that can be suitable for the magnetic resonance force detection apparatus disclosed herein. The interaction of the (nuclear) spin with the superconducting particle is similar, though different in form, to the interaction of the spin with the magnetic particle.

It will be appreciated that the functionality of the single processor 122 that is shown in FIG. 1 can be distributed between a plurality of processors.

Figure 2:
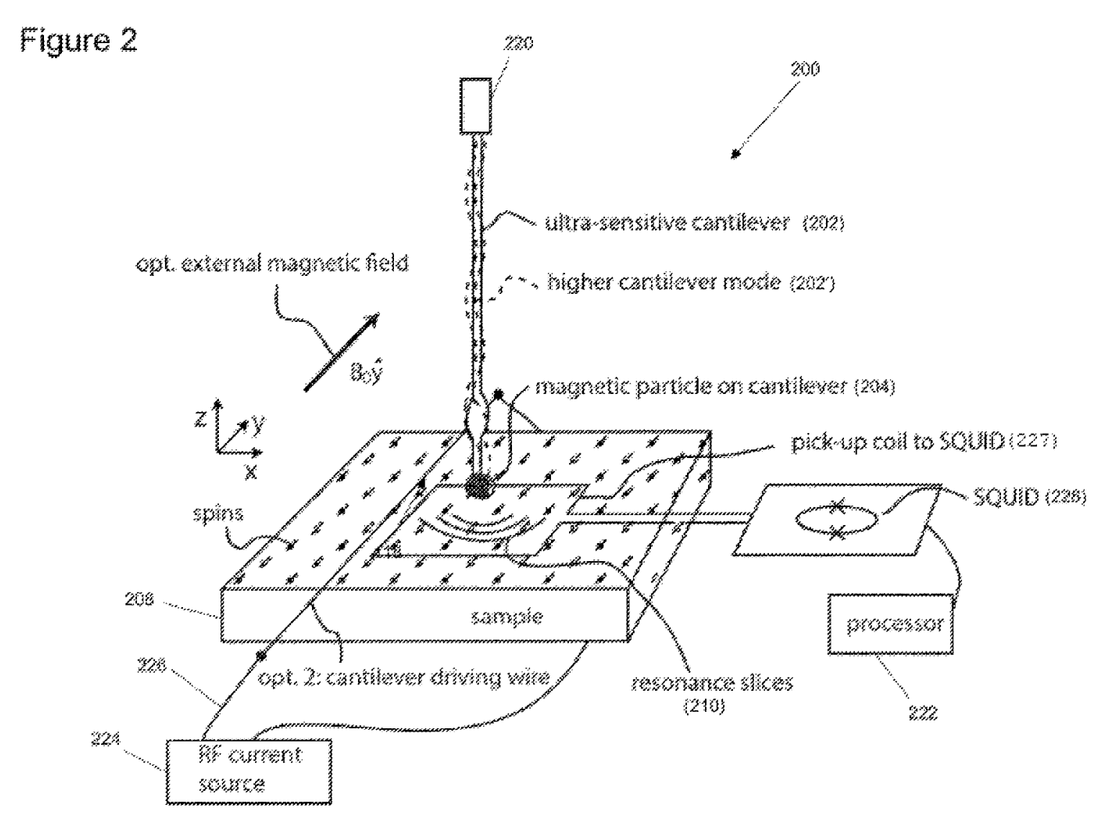
FIG. 2 illustrates another magnetic resonance force detection apparatus.

FIG. 2 illustrates another magnetic resonance force detection apparatus 200. Features that are illustrated in FIG. 1 have been given corresponding numbers in the 200 series and will not necessarily be described again here.

In this example, the locations of the sample 208 and magnetic field source 204 are reversed, when compared with FIG. 1. That is, the magnetic field source 204 is attached to a free end of the cantilever 202, and the sample 108 is statically mounted on a static sample carrier (not shown). In this way the sample carrier is remote from the cantilever 202. In this example, the cantilever 220 has a fixed/stationary end 220. It will thus be appreciated that the sample carrier may be statically mounted relative to a moveable magnetic field source (as in FIG. 2), or mounted on a cantilever such that is moveable relative to a static magnetic field source (as shown in FIG. 1).

The flipping of spins in the sample 208 in this example causes the magnetic field source 204, and therefore also the cantilever 202, to be displaced.

In FIG. 2, a driving wire 226 and a wire-RF-current-source 224 provide the functionality of the support-driving-mechanism. The driving wire 226 is in the vicinity of the magnetic field source 204, and may be a microwire. The wire-RF-current-source 224 causes an oscillating current to flow through the driving wire 226. As will be discussed below, the driving wire 226 passes an alternating current such that it generates an alternating magnetic field in the magnetic field source 204, and thereby causes the magnetic field source 204 to move relative to the sample 208.

When the oscillating current flows through the driving wire 226, an oscillating magnetic field is generated around the driving wire 226. Since the magnetic field source 204 is close to the driving wire 226, this oscillating magnetic field interacts with the magnetic field source 204, applies a force to the magnetic field source 204, and causes the cantilever 202 to oscillate. In this way, the driving wire 226 and the wire-RF-current-source 224 drive a relative movement between the sample 208 and the magnetic field source 204. In the same way as described above with reference to FIG. 1, this relative movement results in an oscillating magnetic field in the sample 208.

When the driving wire 226 drives the cantilever 202 at one of the resonance frequencies of the cantilever 202, the oscillation in the movement of the cantilever 202 is amplified. Due to a higher quality factor, the cantilever 202 can amplify the movement Q times when at resonance with the higher mode. The Q factor of the higher mode can be 200-1000 or even higher. At the fundamental mode, which can be used as the flipping-frequency at which an NMR signal is measured, the quality factor can reach 30,000. It will be appreciated that having higher quality factors can make it easier to drive the system with a tiny force. It can be advantageous to have a high quality factor for the fundamental mode of the cantilever, which can be used for measuring the flipping of spins, because this can yield better performance in detecting the spins. It can also be advantageous to have a high quality factor for a higher order mode of the cantilever, which can be used as the RF-driving mode, because this can create larger amplitudes, and therefore larger B1-fields.

An advantage of using the driving wire 226 and the wire-RF-current-source 224 is that the cantilever 202 can be driven at very low temperatures. Having a cold cantilever 202 can improve sensitivity. In some examples a superconducting driving wire 226 can be used to generate the current that displaces the magnetic field source 204, and this can enable the cantilever 202 to be kept at particularly low temperatures. That is, the current through the driving wire 226 can be kept particularly low, especially when the cantilever 202 is oscillated at one of its higher order frequencies, and therefore the driving wire can generate very little heat. In some examples, use of the driving wire 226 and the wire-RF-current-source 224 of FIG. 2 can enable even lower temperatures to be achieved than the piezo-electric element of FIG. 1. For this reason, the example of FIG. 2 can be considered as providing ultralow dissipation RF-generation.

The support-displacement-measuring-sensor in this embodiment comprises a pick-up coil 227 in the vicinity of the magnetic field source 204 on the end of the cantilever 202. The support-displacement-measuring-sensor also includes a superconducting quantum interference device (SQUID) 228, in electrical connection with the pick-up coil 227.

When the cantilever 202 oscillates, the magnetic field generated by the magnetic field source 204 that goes through the pick-up coil 227 will also oscillate. A change in the total magnetic field (magnetic flux), causes a current to be induced in the pick-up coil 227 to counteract the flux, due to conservation of flux in a superconducting circuit. To keep the heat generated by the current flowing through the pick-up coil 227 as low as possible, the pick-up coil 227 can be provided as a single turn/loop of a wire. The pick-up coil 227 can also be made of a superconducting material. Currents in a superconductor may cause no/negligible heat dissipation.

The SQUID 228 is used to convert the current in the pick-up coil 227 into something that is more conveniently measurable. In this example, an optional superconducting transformer is used to match the inductance of the pick-up coil 227 to the SQUID 228. The SQUID 228 can transform an oscillating current into a voltage, and this voltage can be used as a measurement of the displacement of the cantilever 202. The voltage changes over the SQUID 228 are linearly related to the movement of the cantilever 202. The SQUID 228 can measure (in voltage) tiny flux changes (in the order of 1*10-21 Wb/sqrt(Hz)).

An advantage of this embodiment, when compared to a fibre-optic interferometer, is that it avoids the use of a laser, which can heat up the experiment. With a fibre-optic interferometer it can be difficult to operate below approximately 1 Kelvin because the laser heats up the cantilever. In contrast, use of the pick-up coil 227 and the SQUID 228 of FIG. 2 can be used to determine the displacement of the cantilever 202, whilst maintaining a temperature of about 10 mK.

A further advantage of the apparatus of FIG. 2 when compared with that of FIG. 1 is that a small cantilever 202 can be used—small cantilevers can be difficult to detect with a laser interferometer because of its diffraction limit.

If RF-fields at very high frequencies are required, then the apparatus of FIG. 2 can be used to drive a higher mode of the cantilever 202 by a micro-wire 226.

It will be appreciated that one or more of the implementation features of FIG. 1 can be used in FIG. 2, and vice versa.

In another example (not shown), the field gradient source, the force sensor, the detection of the motion of the force sensor, and the source of the oscillating magnetic field can all advantageously be provided by a single device which is positioned over the sample 208. In this way, the detection and driving apparatus can be completely detached from the sample, and the sample may not need to be patterned. Patterning, in this context, can be the fabrication of a coil and RF-wire by means of nanolithography. This can require a flat sample, or a substrate, on which the patterning is performed, with a small sample on top.

One or more of the examples disclosed herein can also include a support-tuning-component (not shown in the drawings). The support-tuning-component can tune/change an eigen-mode frequency of the support/cantilever.

By driving the spins with the cantilever only specific frequencies can be used, for example the 10 eigen-frequencies between 30 kHz and 1 MHz. This may not be a problem, since moving the resonance slice by moving the magnetic particle towards or away from the sample can have the same effect as moving the resonance slice by varying the driving-frequency.

However, in some applications it may be convenient to move the resonance slice by varying the driving-frequency instead of moving the magnetic particle towards or away from the sample. Advantages associated with tuning the eigen-mode frequencies of the cantilever can include:
1. the selection of a frequency may be performed faster and more precise than is possible changing the relative position of the sample and the magnetic particle.
2. sensitivity can be increased. This can be because it is possible to get the resonance slice closer to the magnetic particle.
3. An avoidance or reduction of an unwanted change of other parameters, which may occur when the relative position of the sample to the magnetic particle is changed.

In some examples, the support-tuning-component can take a measurement during an experiment and then adjust the eigen-frequency based on the measurement. For example, the eigen-frequency can be adjusted based on a measure of the displacement of the cantilever. For example, if a small displacement signal is measured at a specific frequency (because the resonance slice hits a low spin density region), the support-tuning-component can shift/tune the eigen-frequency of the cantilever such that the resonance slice is moved closer to, or further away from the magnetic particle in order for the resonance slice to cover a region with a higher spin density, thereby yielding a larger displacement signal.

The support-tuning-component can apply an electric field or a different appropriate potential to the cantilever in order to change its resonant frequency. For example, a magnetic field can be applied in order to change the resonant frequency of the cantilever.

The electrostatic potential between the tip and the sample results in a repelling or pulling force on the cantilever. This can result in a frequency shift of the cantilever, also when using the higher mode of the cantilever. Using different frequencies enables a situation in which a resonance slice can be shifted without moving the cantilever.

In another example, the support-tuning-component can perform optical trapping in order to change the resonant frequency of the cantilever.

In some examples, nonlinear mixing can be used to drive the cantilever, which can enable a lower driving frequency to be used, which in turn advantageously results in lower dissipation and therefore lower generated heat.

For example, if a higher mode of the cantilever is non-linearly related to its lower modes, then the cantilever can be driven at the higher mode by a combination of (i) N times the lower mode frequency; plus (ii) a secondary-frequency-component. The secondary-frequency-component is selected such that the result of the sum corresponds to the higher mode frequency. The first component of the sum (N times the lower mode frequency) can optionally be provided by piezo-driving the cantilever.

By way of numerical example, a cantilever can be driven at a higher mode of 2 MHz by driving a piezo that has a resonance frequency that is not linearly related to the desired higher mode frequency (for example 220 kHz). The cantilever can be driven at 9 times (N=9) the resonance frequency of the piezo, plus a secondary-frequency-component of 20 kHz such that the resultant frequency is equal to 2 MHz. An advantage of this technique is that the driving frequency is much lower. Furthermore, if the fundamental mode of the cantilever is at 1 MHz, potentially the cantilever could be driven at frequencies of up 100 MHz.

Although the above description relates primarily to the flipping of spins of nuclei, it will be appreciated that the same principles apply to the flipping of electron spins and that the invention is equally applicable to the spin of nuclei and electrons.

Figure 3:
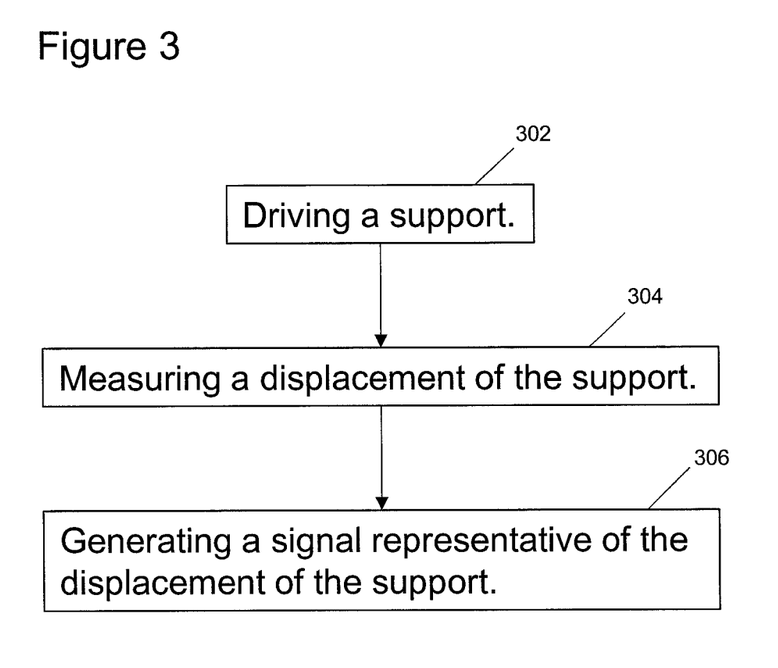
FIG. 3 illustrates schematically a method according to an embodiment of the present invention.

FIG. 3 illustrates schematically a process flow corresponding to a method of an embodiment of the present disclosure. The method is for performing magnetic resonance force detection on a sample supported by a support. In other embodiments, a magnetic field source (or any magnetic field gradient producing structure) may be supported by the support instead of the sample.

The method begins at step 302 by driving the support such that a sample carrier moves relative to the magnetic field source. Due to this relative movement, a magnetic field causes the spins of one or more nuclei or electrons in the sample to flip. As discussed above, the flipping of spins exerts a force on the support.

At step 304, the method involves measuring a displacement of the support, for example using a fibre-optic interferometer or a pick-up coil and a SQUID. At step 306, the method involves generating a signal representative of the displacement of the support. This signal can be used to create an image of a biological sample, for example.

The apparatus disclosed herein has been used in an MRFM experiment on copper, by using a piezo-electric element to generate the necessary B1 fields at frequencies between 500 kHz and 700 kHz. B1 fields of 30 µT can be generated with small angle (0.07 degree) vibrations. Frequencies of up to 1 MHz can be generated by looking at the highest modes of the resonator that were used.

The magnetic field source may be a 3 µm diameter, or smaller, magnetic particle. For example a 1 µm diameter particles can be used. Even smaller particles can also be used by using external fields to magnetize soft magnetic materials. The B1-field can be significantly (orders of magnitude) improved when using smaller magnets, because the B1 field is determined by the product of the motion and the field gradient. Smaller magnets have larger field gradients close to the magnet. Moreover, a larger vibration amplitude and higher frequencies can be achieved more easily when using smaller magnets. Large magnetic fields can give more possibilities in manipulating spins in a sample.

One or more of the techniques described above can significantly lower heat-dissipation when compared to generating RF magnetic fields by oscillating currents. This is especially relevant for low temperature MRFM, which can be particularly sensitive.

Also, advantageously, a single device (the cantilever) can be used to generate a radio frequency oscillating magnetic field (B1-field) and detect the flipping of spins. In the case of an RF magnetic source that is electrically driven (as opposed to mechanically driven as in the examples of FIGS. 1 and 2), carefully designed RF-circuitry may be necessary, where the sample has to be as close to the RF-source as possible. In the examples of FIGS. 1 and 2, the cantilever itself is involved in generating the RF-source, which can be positioned above the sample at any place. In other words, the range of samples that are suited for investigation by MRFM can be extended by the apparatus of FIGS. 1 and 2.

One or more of the examples described herein relate to a mechanical radiofrequency source with ultralow dissipation. They can comprise a diving board shaped mechanical resonator, which can have a magnetic moment at its end (for example by the attachment of a magnetic particle to the end of cantilever).

The invention claimed is:

1. A magnetic resonance force detection apparatus, comprising:
    a magnetic field source configured to provide a magnetic field to a sample;
    a support for supporting either the sample or the magnetic field source;
    a support-driving-mechanism configured to drive the support such that the sample moves relative to the magnetic field source, such that the magnetic field is configured to cause spins of one or more nuclei or electrons in the sample to flip, and wherein the flipping of spins exerts a force on the support; and
    a support-displacement-measuring-sensor configured to measure displacement of the support and generate a signal representative of the displacement of the support, wherein the support-driving-mechanism is configured to drive the support at a frequency that corresponds to a higher eigen-mode frequency of the support.

2. The magnetic resonance force detection apparatus of claim 1, wherein the support-driving-mechanism is configured to mechanically drive the support such that the sample moves relative to the magnetic field source.

3. The magnetic resonance force detection apparatus of claim 1, wherein the support-driving-mechanism is configured to drive the support such that the sample oscillates relative to the magnetic field source.

4. The magnetic resonance force detection apparatus of claim 1, wherein the relative movement between the sample and the magnetic field source is configured to cause the sample to experience an oscillating magnetic field.

5. The magnetic resonance force detection apparatus of claim 1, wherein the magnetic field source is configured to provide a static magnetic field.

6. The magnetic resonance force detection apparatus of claim 1, wherein the magnetic field source comprises a magnetic particle.

7. The magnetic resonance force detection apparatus of claim 1, wherein the support-driving-mechanism is configured to drive the support at an RF frequency.

8. The magnetic resonance force detection apparatus of claim 1, wherein the support-driving-mechanism comprises a piezo-electric element that vibrates the support.

9. The magnetic resonance force detection apparatus of claim 1, further comprising a processor configured to process the signal representative of the displacement of the support in order to determine a component of the displacement of the support caused by the flipping of spins in the sample due to the magnetic field source.

10. The magnetic resonance force detection apparatus of claim 1, further comprising a processor configured to control the support-driving-mechanism in order to define:
    a driving-mode-of-operation, during which the support-driving-mechanism drives the support; and
    a measuring-mode-of-operation, during which an output signal of the support-displacement-measuring-sensor is used to generate the signal representative of the displacement of the support.

11. The magnetic resonance force detection apparatus of claim 10, wherein, during the measuring-mode-of-operation, the support-driving-mechanism is configured to not drive the support.

12. The magnetic resonance force detection apparatus of claim 1, further comprising a processor configured to control the support-driving-mechanism in order to drive the support at a driving-frequency, which causes the spins of the one or more nuclei or electrons in the sample to flip at a flipping-frequency, and wherein the driving-frequency is different to the flipping-frequency.

13. The magnetic resonance force detection apparatus of claim 12, wherein the flipping-frequency is an eigen-mode frequency of the support.

14. The magnetic resonance force detection apparatus of claim 1, wherein:
    the magnetic field source is attached to the support;
    the support-driving-mechanism comprises a driving wire that is in the vicinity of the magnetic field source,
    the driving wire is configured to pass an alternating current such that it generates an alternating magnetic field in the magnetic field source, and thereby causes the magnetic field source to move relative to the sample.

15. The magnetic resonance force detection apparatus of claim 1, wherein:
    the magnetic field source is attached to the support; and
    the sample is remote from the support.

16. The magnetic resonance force detection apparatus of claim 1, further comprising a support-tuning-component configured to change an eigen-mode frequency of the support.

17. The magnetic resonance force detection apparatus of claim 1, wherein the support-driving-mechanism is configured to drive the support using non-linear mixing.

18. A method of performing magnetic resonance force detection for a sample using a magnetic field source, wherein either the sample or the magnetic field source is supported by a support, the method comprising;
    driving the support such that the sample moves relative to the magnetic field source, such that the magnetic field is configured to cause the spins of one or more nuclei or electrons in the sample to flip, and wherein the flipping of spins exerts a force on the support:
    measuring a displacement of the support; and
    generating a signal representative of the displacement of the support, wherein the support-driving-mechanism is configured to drive the support at a frequency that corresponds to a higher eigen-mode frequency of the support.

* * * * *